United States Patent

Lahiri

(10) Patent No.: US 9,018,987 B1
(45) Date of Patent: Apr. 28, 2015

(54) CURRENT REUSED STACKED RING OSCILLATOR AND INJECTION LOCKED DIVIDER, INJECTION LOCKED MULTIPLIER

(71) Applicant: STMicroelectronics International N.V., Amsterdam (NL)

(72) Inventor: Abhirup Lahiri, Delhi (IN)

(73) Assignee: STMicroelectronics International N.V., Amsterdam (NL)

(*) Notice: Subject to any disclaimer, the term of this patent is extended or adjusted under 35 U.S.C. 154(b) by 0 days.

(21) Appl. No.: 14/090,744

(22) Filed: Nov. 26, 2013

(51) Int. Cl.
| | |
|---|---|
| H03B 19/00 | (2006.01) |
| H03L 7/00 | (2006.01) |
| H03K 3/03 | (2006.01) |
| H03K 23/54 | (2006.01) |
| H03L 7/099 | (2006.01) |

(52) U.S. Cl.
CPC ............... H03L 7/00 (2013.01); H03K 3/0315 (2013.01); H03K 23/54 (2013.01); H03L 7/0995 (2013.01)

(58) Field of Classification Search
CPC ..... H03K 3/0315; H03K 23/54; H03L 7/0995
USPC ............ 327/113–119; 331/46, 47, 50–53, 57; 377/47, 48
See application file for complete search history.

(56) References Cited

U.S. PATENT DOCUMENTS

| | | | |
|---|---|---|---|
| 5,764,111 A | 6/1998 | Bushman | |
| 8,174,288 B2 | 5/2012 | Dennard et al. | |
| 8,638,175 B2* | 1/2014 | Dubey | 331/57 |
| 2006/0001496 A1* | 1/2006 | Abrosimov et al. | 331/57 |
| 2006/0087350 A1* | 4/2006 | Ruffieux | 327/117 |
| 2007/0001771 A1* | 1/2007 | Hori et al. | 331/57 |
| 2009/0033431 A1* | 2/2009 | Yamashita et al. | 331/57 |

OTHER PUBLICATIONS

Chen et al., "18 GHz and 7 GHz Superharmonic Injection-locked Dividers in 0.25 μm CMOS Technology," *Proceedings of the 28th European Solid-State Circuits Conference*, pp. 89-92, Sep. 2002.
Verma et al., "A Unified Model for Injection-Locked Frequency Dividers," IEEE *Journal of Solid-States Circuits 38*(6):1015-1027, Jun. 2003.
Yamamoto et al., "A 44-μW 4.3-GHz Injection-Locked Frequency Divider With 2.3-GHz Locking Range," *IEEE Journal of Solid-State Circuits 40*(3):671-677, Mar. 2005.

* cited by examiner

*Primary Examiner* — Patrick O'Neill
(74) *Attorney, Agent, or Firm* — Seed IP Law Group PLLC

(57) ABSTRACT

A phase locked loop includes a voltage controlled oscillator and a frequency divider or frequency multiplier. The voltage controlled oscillator and the frequency divider/multiplier are coupled together in a stacked configuration. A drive current is supplied to the voltage controlled oscillator. The drive current passes from the voltage controlled oscillator to the frequency divider/multiplier, thereby driving the frequency divider/multiplier with the same drive current that was supplied to the voltage controlled oscillator.

18 Claims, 9 Drawing Sheets

CURRENT REUSED STACKED RING OSCILLATOR AND INJECTION LOCKED DIVIDER, INJECTION LOCKED MULTIPLIER

BACKGROUND

1. Technical Field

The present disclosure relates to the field of voltage controlled oscillators. The present disclosure relates more particularly to the field of ring oscillators.

2. Description of the Related Art

Phase locked loops are commonly used in integrated circuits to ensure that clock signals used throughout the integrated circuit die have phases that are locked together. Phase locked loops typically include a voltage controlled oscillator (VCO) that generates an oscillator signal having a particular frequency. Typically, the phase locked loop also includes an input oscillator signal. The phase locked loop ensures that the phase of the input oscillator signal and the phase of the oscillator signal generated by the VCO are locked together in a particular relationship.

To assist in this, the phase locked loop typically includes a frequency divider that divides the oscillator signal by some integer number. The frequency divider is in the feedback path of the phase locked loop and it divides the voltage controlled oscillator output. The divided oscillator signal is fed back to a phase detector. The input oscillator signal is also provided to the phase detector. The phase detector outputs a phase difference signal indicative of a phase difference between the divided oscillator signal and the input oscillator signal. The phase difference signal is fed back to the voltage controlled oscillator with the fact that the output oscillator signal of the VCO has a phase that is locked with the phase of the input oscillator signal.

With state-of-the art phase-locked loops outputting frequencies in the multi-GHz frequency range, power optimization is a key goal to increase the battery life. Reducing the power consumption of the divider is beneficial in realizing low-power PLL.

However, standard frequency dividers consume large amounts of power. In particular, at RF frequencies the power consumed by the frequency divider is a substantial portion of the total phase locked loop power consumption. It is desirable to provide a phase locked loop with reduced power consumption.

BRIEF SUMMARY

One embodiment is a phase locked loop including a voltage controlled oscillator and a frequency divider having reduced power consumption. The voltage controlled oscillator is driven by a fixed drive current provided by a current source. The frequency divider is coupled to the voltage controlled oscillator in a stack configuration such that the drive current passes from the voltage controlled oscillator through the frequency divider.

In one embodiment, a low side power supply terminal of the voltage controlled oscillator is connected to a high side power supply terminal of the frequency divider. Thus, the drive current from the voltage controlled oscillator is reused in the frequency divider. No additional current is used to drive the frequency divider. The frequency divider is driven entirely by the current from the voltage controlled oscillator.

DETAILED DESCRIPTION

Figure 1:
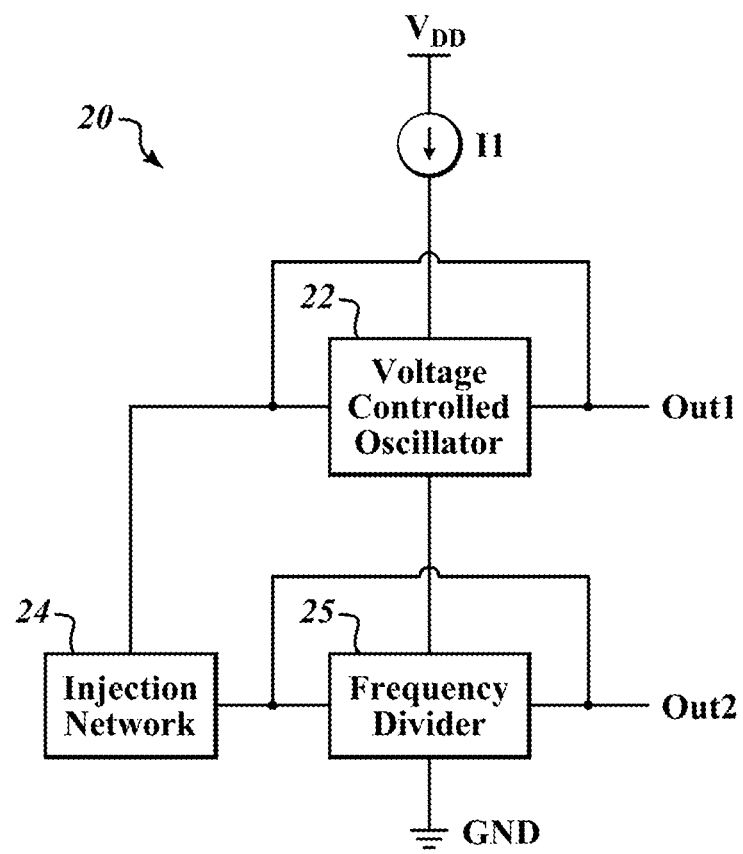
FIG. 1 is a block diagram of a portion of a phase locked loop according to one embodiment.

FIG. 1 is a block diagram of a portion of a phase locked loop 20 according to one embodiment. The phase locked loop 20 includes a voltage controlled oscillator 22, an injection network 24, and a frequency divider 25. A current source I1 supplies a drive current to the voltage controlled oscillator 22.

The voltage controlled oscillator 22 generates an oscillation signal OUT1. The oscillation signal OUT1 has a particular frequency according to the structure of the voltage controlled oscillator, the driving current, and an input frequency signal (not shown). The oscillator signal is supplied to the input of the voltage controlled oscillator 22.

The injection network 24 receives the oscillation signal from the voltage controlled oscillator 22. The injection network 24 removes the DC component of the output oscillation signal and provides the oscillating component to the frequency divider 25.

The frequency divider receives an injection oscillation signal from the injection network 24 and outputs a divided oscillator signal. The divided oscillator signal has a frequency which is some fraction of the frequency of the output oscillation signal from the voltage controlled oscillator 22. The divided oscillator signal is fed back to the input of the frequency divider 25.

The voltage controlled oscillator 22 and the frequency divider 25 are coupled together in a stacked configuration. In particular, the voltage controlled oscillator 22 and the frequency divider 25 are connected in such a way that the drive current I1 passes from the voltage controlled oscillator 22 to the frequency divider 25. The frequency divider 25 is therefore driven by the same current that passes through the voltage controlled oscillator 22. In this way, the drive current I1 is reused to drive the frequency divider 25. The frequency divider 25 is therefore driven without consuming any additional power than what is consumed by the voltage controlled oscillator 22. This saves a considerable amount of power in the phase locked loop 20.

In an integrated circuit die, there are a large number of components that must all be powered by particular voltages in order to ensure that the integrated circuit die functions in the desired manner. For this reason, the supply voltage VDD is carefully selected by the designers of the integrated circuit die to be able to achieve the overall purposes of the integrated circuit die. Thus, the voltage VDD is typically not selected to optimize the power consumption of the phase locked loop 20. This is because the phase locked loop 20 is only one of many components in the integrated circuit die.

The voltage controlled oscillator 22 and the frequency divider 25 each include many transistors. As the features within integrated circuit dies have continued to shrink, transistors having very low threshold voltages $V_p$ have become available to integrated circuit die designers. As the threshold voltages of transistors decreases, supply voltages used to switch the transistors on and off and to drive the transistors also decreases. Thus, the supply voltage needed to drive the transistors of the voltage controlled oscillator 22 and the frequency divider 25 may be much smaller than that which has been selected by the designers of the integrated circuit die. In other words, the transistors of the voltage controlled oscillator 22 and the frequency divider 25 can be given by a voltage much smaller than the voltage difference between VDD and ground.

Because the supply voltage VDD is much larger than necessary to drive the voltage controlled oscillator 22, the same current I1 which drives the voltage controlled oscillator 22 can be used to drive the frequency divider 25 without any problem. In this way, in one example, about half of VDD is dropped across the voltage controlled oscillator 22. The voltage at a node between the voltage controlled oscillator 22 and the frequency divider 25 is therefore about VDD/2 in one example. The voltage difference between VDD and VDD/2 is sufficient to drive the voltage controlled oscillator 22. The remaining voltage is dropped across the frequency divider 25. Alternatively, more or less than half of VDD can be dropped across the oscillator 22.

The power consumed in an electrical circuit is equal to the product of the current passing through the electrical circuit and the voltage dropped across the electrical circuit. The power consumed by the voltage controlled oscillator 22 and the frequency divider 25 is therefore I1×VDD. This is the same amount of power that would be consumed if the frequency divider 25 was not present and the voltage controlled oscillator 22 was coupled directly between VDD and ground. In this case, the power consumed would also be the total voltage drop, VDD, multiplied by the current I1. Thus, by placing the frequency divider 25 in the current path of the voltage controlled oscillator 22, the frequency divider 25 can be driven without any extra power being consumed. The frequency divider 25 is therefore a zero-power device in the phase locked loop 20 of FIG. 1.

In one embodiment, the voltage controlled oscillator is a ring oscillator including a plurality of inverters connected in series. The frequency divider 25 is also a ring oscillator including a plurality of inverters connected in series.

The output frequency of the frequency divider 25 can be selected by including additional inverters in the series chain of inverters. The more inverters in the chain, the lower the frequency. Thus, the frequency divider 25 can easily be made to output a divided frequency which is ½, ¼, or ⅛ of the frequency of the output signal from the voltage controlled oscillator 22.

As indicated previously, the injection network transistor (Minj) acts like a mixer device to help generate frequencies $f_{in} \pm k f_o$, where the input signal with frequency $f_{in}$ is derived from oscillator 22 and harmonics (k=1, 2, 3 . . . ) of divider oscillator 25 with fundamental frequencies $f_o$. If one of these frequencies is closest to the free running frequency of the divider 25, and if there is enough power available, then the frequency of divider 25 is pulled and finally locked to that frequency, i.e. $f_{in} - k f_o = f_o$. Which means fo=fin/(1+k). In the simplest case, when k=1 we can create an injection locked divide by two divider 25. Higher divisions like ¼, ⅙ can also be carried out using the same apparatus as shown in FIG. 1 and with either appropriately sizing the inverters in the divider 25 or adding more inverter stages in the divider 25 so as to first order center the divider oscillator frequency. However, higher division ratios are difficult to achieve due to reduced signal amplitude at higher harmonics because the amplitude of harmonics k*fo reduces as we go to higher values of, k and hence the injection locking range reduces considerably thereby making it very difficult to generate high division factors (e.g. ¼, ⅙).

In one embodiment, the frequency divider is a divide-by-1 frequency divider. In this case, the frequency divider 25 is a buffer which outputs an oscillator signal having the same frequency as the oscillator signal from the voltage controlled oscillator 22.

The configuration of using a ring oscillator based VCO 22 and ring oscillator based divider/multiplier 25 placed beneath the VCO 22 and re-using the same current I1 has an additional advantage of tracking the center frequencies of the two oscillators. The secondary oscillator is sized appropriately to be used as either a divider or a multiplier. For a divider, the width-to-length of the transistors in the inverters of the secondary oscillator 25 is two times that of the transistors in the inverters of the primary oscillator 22, thereby ensuring that center frequencies of the two oscillators, even without injection locking, is roughly ½.

Even without the injection network in place, transistors in the divider 25 are sized to oscillate at approximately half the frequency of the oscillator 22. Although, the free-running frequency of the divider 25, i.e., without injection locking, is not exactly one half the frequency of the oscillator 22 across process and temperature corners, this leads to inherent first-order tracking of frequencies of the main oscillator and ILFD with process and temperature corners and hence also relaxes the difference in frequencies the injection network needs to compensate.

The current-reused injection locked divider in FIG. 1 uses the Miller-Regenerative-Divider concept, wherein the input signal with frequency $f_{in}$ derived from oscillator 22 and harmonics (k=1, 2, 3 . . . ) of divider oscillator 25 with fundamental frequencies $f_o$ mix together via the injection network to create additional frequencies ($f_{in} \pm k f_o$). If one of these frequencies is closest to the free running frequency of the oscillator 25, and if there is sufficient power available, the frequency of oscillator 25 is pulled and finally locked to that frequency, i.e. $f_{in} - k f_o = f_o$. This is the basis of super-harmonic injection locking to create an injection locked frequency divider. The oscillator 25 itself acts like a frequency selective filter suppressing mixer products higher than $f_o$. It has been derived in (add references here), that the lock range of the injection locked frequency dividers depend of operating frequency (fo) and ratio of injection signal amplitude to oscillation amplitude.

Figure 2:
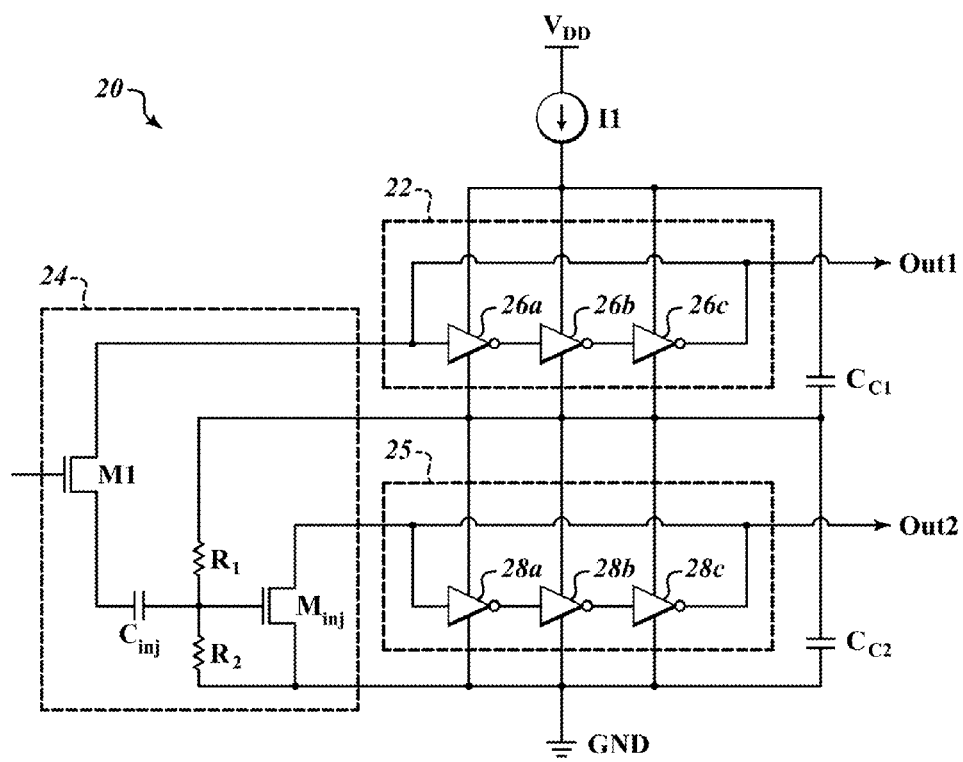
FIG. 2 is a schematic diagram of a voltage controlled oscillator and a frequency divider in a stacked configuration according to one embodiment.

FIG. 2 is a schematic diagram of a portion of a phase locked loop including a voltage controlled oscillator 22, a frequency divider 25, and an injection network 24. The voltage controlled oscillator 22 includes three inverters 26a-26c connected together in series. The frequency divider 25 includes three inverters 28a-28c connected together in series. High side supply terminals of the inverters 26a-26c are all connected together. The current source I1 supplies the drive current to the high side power supply inputs of the inverters 26a-26c. The low side supply terminals of the inverters 26a-26c are likewise connected together. The high side supply terminals of the inverters 28a-28c are connected to each other and to the low side supply terminals of the inverters 26a-26c. The low side supply terminals of the inverters 28a-28c are connected to ground. The output of the inverter 26c is connected to the input of the inverter 26a. The output of the inverter 28c is connected to the input of the inverter 28a. The injection network 24 includes a first switch $M_1$ connected to the input of the inverter 26a. The source of the transistor $M_1$ is connected to a first terminal of an injection capacitor $C_{inj}$. A second terminal of the injection capacitor $C_{inj}$ is connected to a gate terminal of an injection transistor $M_{inj}$. The drain terminal of the transistor $M_{inj}$ is connected to the input of the inverter 28a. The source of the injection transistor $M_{inj}$ is connected to ground. A resistor $R_1$ is connected between the gate of the injection transistor $M_{inj}$ and the low-side supply terminal of the inverters 26a-26c. A resistor $R_2$ is connected between the gate of the transistor $M_{inj}$ and ground.

The voltage controlled oscillator 22 is a ring oscillator. The voltage controlled oscillator 22 outputs an oscillator signal having a frequency $F_{not}$ from the output of the inverter 26c. The output of the inverter 26c is connected to the input of the inverter 26a. In this the voltage controlled oscillator 22 receives at its input the output oscillation signal.

Because there are an odd number of inverters and the inverter 26a receives at its input the output of the inverter 26c, the oscillator signal is generated at the output of the inverter 26c. Because the output of an inverter is the logical "not" of the input, when the input of the inverter 26a is high, the output of the inverter 26a will transition low. Because the output of the inverter 26a is coupled to the input of the inverter 26b, when the output of the inverter 26a transitions low, the output of the inverter 26b will transition high. Because the output of the inverter 26b is connected to the input of the inverter 26c, when the output of the inverter 26b transitions high, the output of the inverter 26c will transition low. Because the output of the inverter 26c is fed back to the input of the inverter 26a, the input of the inverter 26a will transition from a previously high state to a low state of the output of the inverter 26c. When the input of the inverter 26a is low, the output of the inverter 26c will transition high. Thus, an oscillating signal is generated at the output of the inverter 26c. Each of the transitions from high to low or from low to high at the outputs of the inverters 26a-26c takes a finite amount of time. The period of the oscillator signal is the product of the number of inverters in the ring oscillator 22 multiplied by the time required for an inverter to make a single transition from a low to a high state or from a high state to a low state multiplied by by 2, because each clock cycle includes two transitions between the high and the low states. For example, if the transition time for one of the inverters 26a-26c of the voltage controlled oscillator 22 is 0.1 nanoseconds, then the total period of the oscillator signal is 0.6 nanoseconds. If the period of the oscillator signal is 0.6 nanoseconds, then the frequency of the oscillator signal, which is the inverse of the period of the oscillator signal, is about 1.6 GHz. The period of transition between high and low states corresponds to the time it takes for the inherent capacitors of the transistors of the inverters 26a-26c to charge or discharge. The time required for the inherent capacitors of the transistors to charge or discharge depends in part on the dimensions of the gate electrode and the gate channel region, as well as the current that drives the inverters. The inverters 26a-26c are driven by the driving current I1. The higher the drive current I1, the faster the inverters 26a-26c can transition between the high and low states. Because the output frequency $F_{not}$ of the oscillator signal is dependent on the drive current I1, $F_{not}$ can be adjusted by adjusting the current I1.

The drive current passes through the inverters 26a-26c and is supplied to the inverters 28a-28c via the low side supply terminals of the inverters 26a-26c. The drive current I1 powers the inverters 28a-28c. In particular, the drive current I1 passes from the high side supply terminals of the inverters 28a-28c to the low side supply terminals of the inverters 28a-28c, and on to ground.

The frequency divider 25 functions in a similar manner as the voltage controlled oscillator 22. As stated previously, the frequency divider 25 is a voltage controlled oscillator. In particular, both the voltage controlled oscillator 22 and the frequency divider 25 are ring oscillators in the example of FIG. 2. The frequency divider 25 receives the output oscillator signal from the voltage controlled oscillator 22. In particular, the output oscillator signal is supplied from the output of the inverter 26c to the switch $M_1$. The switch $M_1$ is used as an On/Off switch, thereby enabling or disabling the injection locking. When $M_1$ is in an on state, the output oscillator signal from the voltage controlled oscillator 22 is supplied to the injection capacitor $C_{inj}$. $C_{inj}$ filters the DC component of the oscillator signal from the voltage controlled oscillator 22 and passes only the oscillator component of the oscillator signal from the voltage controlled oscillator 22. The frequency component of the output oscillator signal is an injection oscillator signal supplied to the gate of the injection transistor $M_{inj}$. The injection oscillator signal is fed to the input of the inverter 28a through the injection transistor $M_{inj}$. The resistors $R_1$ and $R_2$ form a voltage divider which supplies a DC bias voltage to the gate of the injection transistor $M_{inj}$. The voltage difference between the low side supply terminals of the inverters 26a-26c and ground is divided by the resistors $R_1$ and $R_2$. The voltage at the low side supply terminals of the inverters 26a-26c is about VDD/2. If $R_1$ and $R_2$ are approximately equal, then the DC bias voltage on the gate of the injection transistor $M_{inj}$ will be about VDD/4. The DC bias voltage at the gate of the injection transistor $M_{inj}$ can be selected by selecting particular values of the resistors $R_1$ and $R_2$.

The injection network 24 causes an injection oscillator signal having frequency $F_{inj}$ to appear at the gate of the transistor $M_{inj}$. In one embodiment, the frequency divider 25 is a divide-by-2 injection locked frequency divider. The injection locked frequency divider 25 will output a divided oscillator signal having a frequency $F_2$. The divided oscillator signal is generated at the output of the inverter 28c and fed to the input of the inverter 28a. Because a frequency $F_{inj}$ is on the gate of the transistor $M_{inj}$, and the frequency $F_2$ is at the drain of the transistor $M_{inj}$, the transistor $M_{inj}$ switches on and off and is nonlinear. This means that multiple frequencies will appear at the drain of the transistor $M_{inj}$. In particular, there will be frequencies corresponding to $F_{inj} \pm F_2$ on the drain of the injection transistor $M_{inj}$. There will also be other harmonics, but those will not be discussed here. The transistors of the inverters 28a-28c have a width-to-length ratio W/L which is 2 times the width-to-length ratio of the transistors of the inverters 26a-26c of the voltage controlled oscillator 22. Because the width-to-length ratio of the transistors in the frequency divider 25 are twice as large as the width-to-length ratios of the transistors in the voltage controlled oscillator 22, the inverters 28a-28c switch about half as fast. This is because it takes longer to charge and discharge the inherent capacitances of the transistors in the inverters 28a-28c due to the larger channel width-to-length ratios. This means that the output frequency will preferentially lock in at $F_{inj}-F_2$.

Because $F_{inj}$ is the same frequency $F_{not}$ of the voltage controlled oscillator 22, the output frequency of the frequency divider 25 will be $F_{not}/2$.

In this way, a frequency divider 25 can be implemented in the phase locked loop 20, reusing the drive current supplied to the voltage controlled oscillator 22. Thus no extra power is consumed to drive the injection block frequency divider 25.

In alternate embodiments, the injection locked frequency divider 25 can output a different frequency than a divide-by-2 frequency. The frequency divider 25 can be a divide-by-1 frequency divider, which is a buffer for the voltage controlled oscillator 22. Likewise, the frequency divider 25 can be a frequency multiplier outputting a frequency which is a multiple of the output frequency $F_{not}$ of the oscillator signal generated by the voltage controlled oscillator 22. Those of skill in the art will understand that the voltage controlled oscillator 22 and frequency divider 25 can be implemented in many other ways in light of principles of the present disclosure without departing from the scope of the present disclosure. All such other implementations fall within the scope of the present disclosure.

While oscillators 22 and 25 have been described as voltage controlled oscillators, they could also be termed current controlled oscillators. The oscillators 22 and 25 are driven by a current source I1 derived from a control voltage Vc by any voltage-to-current conversion circuit. In one example, this voltage-to-current conversion can be done by a single MOS transistor. Thus, the oscillators 22 and 25 can be termed voltage controlled oscillators or current controlled oscillators.

Figure 3:
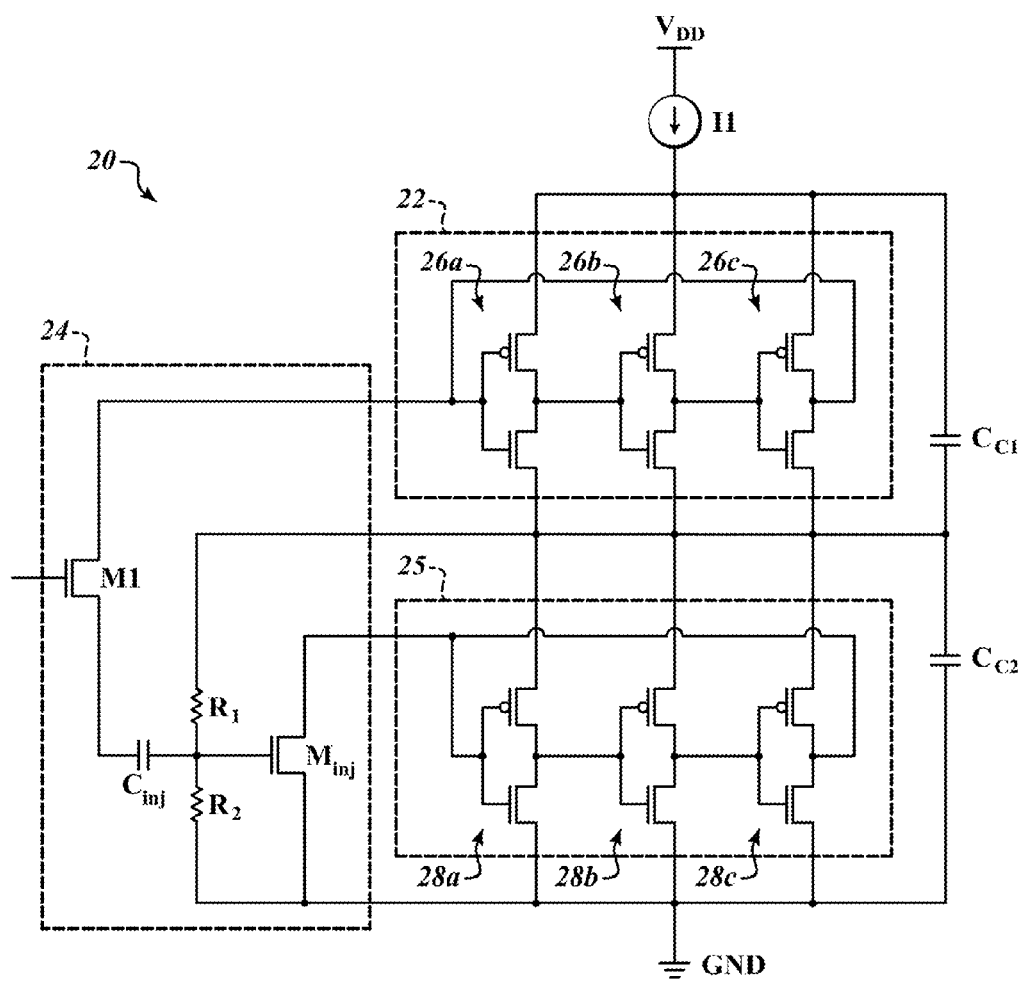
FIG. 3 is a schematic diagram of a voltage controlled oscillator and a frequency divider in a stack configurations according to a further embodiment.

FIG. 3 is a schematic diagram of a phase locked loop 20 including a voltage controlled oscillator 22 and a frequency divider 25 according to one embodiment. The voltage controlled oscillator 22 and the frequency divider 25 of FIG. 3 function in the same manner as the frequency divider 25 and voltage controlled oscillator 22 of FIG. 2. The inverters 26a-26c of the voltage controlled oscillator 22 each include a respective NMOS and PMOS transistor. The input of the inverter 26a corresponds to the gate terminals of the PMOS and NMOS transistors of the inverter 26a. The gate terminals of the PMOS and NMOS transistors of the inverter 26a are coupled together. The output of the inverter 26a corresponds to the drain terminals of the NMOS and PMOS transistor of the inverter 26a. The drain terminals of the NMOS and PMOS transistors of the inverter 26a are connected to each other. The high side supply terminal of the inverter 26a corresponds to the source of the PMOS transistor of the inverter 26a. The low side supply terminal of the inverter 26a corresponds to the source of the NMOS transistor of the inverter 26a. The inverters 26b and 26c are identical to the inverter 26a. The gate terminals of the inverter 26b are coupled to the drain terminals of the inverter 26a. In other words, the input of the inverter 26b is coupled to the output of the inverter 26a. Likewise, the input of the inverter 26c is coupled to the output of the inverter 26b. The drain terminals of the NMOS and PMOS transistors of the inverter 26c are coupled to the gate terminals of the NMOS and PMOS transistors of the inverter 26a. The high side supply terminal of the voltage controlled oscillator 22 therefore corresponds to the common node to which the source terminals of the PMOS transistors of the inverters 26a-26c are connected. The low side supply terminal of the voltage controlled oscillator 22 corresponds to the source terminals of the NMOS transistors of the inverters 26a-26c. The drive current I1 is supplied to the source terminals of the PMOS transistors of the inverters 26a-26c and it passes through the source terminals of the NMOS transistors of the inverters 26a-26c.

The inverters 28a-28c of the frequency divider 25 are similar to the inverters 26a-26c of the voltage controlled oscillator 22. In particular, each inverter 28a-28c includes a respective pair of an NMOS and PMOS transistor. The gates of the NMOS and PMOS transistors of each inverter are connected together and are the input of the respective inverters 28a-28c. The drain terminals of each pair of NMOS and PMOS transistors are the output of the respective inverters 28a-28c. The output of the inverter 28a is connected to the input of the inverter 28b. The output of the inverter 28b is connected to the input of the inverter 28c. The output of the inverter 28c is connected to the input of the inverter 28a. The high side supply terminal of the frequency multiplier 25 corresponds to the source terminals of the PMOS transistors of the inverters 28a-28c. The low side supply terminal of the frequency divider 25 corresponds to the source terminals of the NMOS transistors of the inverters 28a-28c. The transistors of the inverters 28a-28c may have a different width-to-length ratio than the transistors of the inverters 26a-26c, as described previously in relation to FIG. 2. In particular, by selecting particular width-to-length ratios of the transistors of the inverters 28a-28c and of the inverters 26a-26c, the frequency divider 25 can divide the frequency of the oscillator signal generated by the voltage controlled oscillator 22.

As described previously, the drive current I1 passes through the voltage controlled oscillator 22 to the frequency divider 25. In particular, the drive current I1 passes from the source terminals of the NMOS transistors of the inverters 26a-26c to the source terminals of the PMOS transistors of the inverters 28a-28c. In this way, the drive current that powers the voltage controlled oscillator 22 is reused to power the frequency divider 25. The frequency divider 25 is therefore a zero-power device, consuming no excess power than would be consumed if it were not present.

While the inverters 26-26c and 28a-28c have been shown as including an NMOS and a PMOS transistor, any implementation of inverter or delay stage can be used in accordance with principles of the present disclosure. All such other implementations fall within the scope of the present disclosure.

Figure 4:
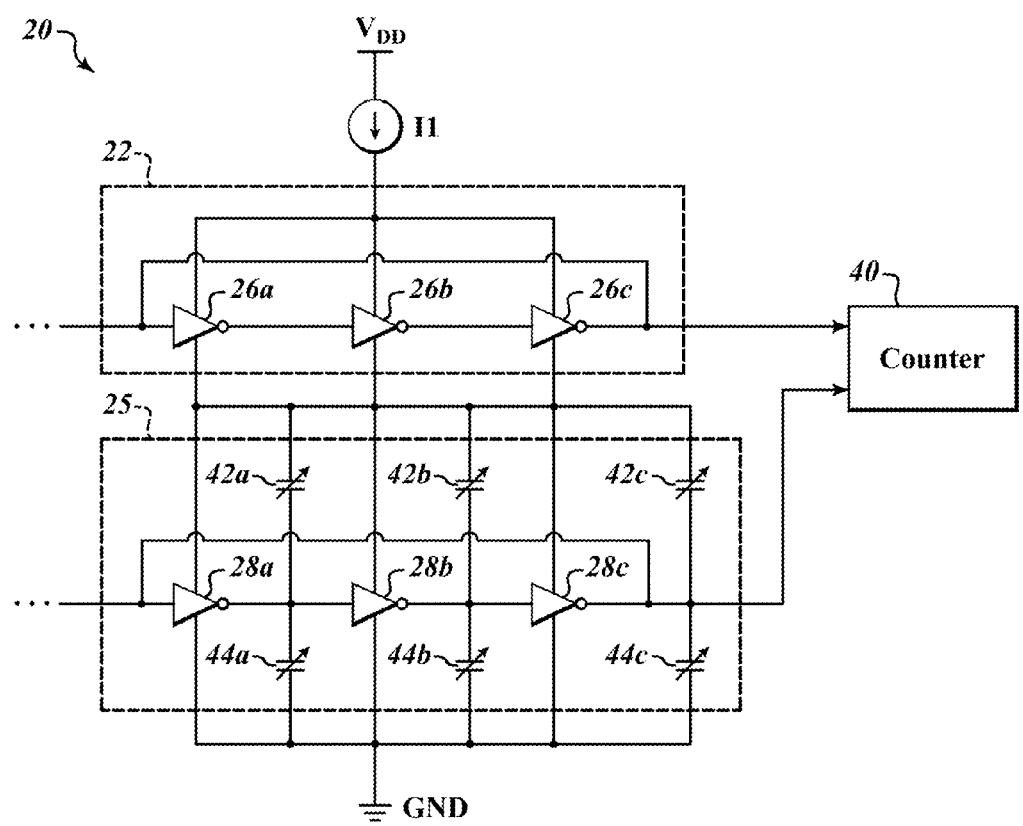
FIG. 4 is a schematic diagram of a voltage controlled oscillator and a frequency divider including capacitive frequency tuners according to one embodiment.

FIG. 4 is a schematic diagram of a voltage controlled oscillator 22 and a frequency divider 25 of a phase locked loop 20 according to one embodiment. The voltage controlled oscillator 22 and the frequency divider 25 are identical to those shown in FIG. 2 except that tuning capacitors 42a-42c and 44a-44c are connected to the inverters 28a-28c of the frequency divider 25. In particular, first tuning capacitors 42a-42c are connected between the high side supply terminal of the frequency divider 25 and respective outputs of the inverters 28a-28c. In particular, the variable capacitor 42a is connected between the output of the inverter 28a and the high side supply terminal of the frequency divider 25. The tuning capacitor 42b is coupled between the output of the inverter 28b and the high side supply terminal of the frequency divider 25. The tuning capacitor 42c is connected between the output of the inverter 26c and the high side supply terminal of the frequency divider 25. Second tuning capacitors 44a-44c are connected between the low side supply terminal of the frequency divider 25 and respective outputs of the inverters 28a-28c. In particular, a tuning capacitor 44a is coupled between the output of the inverter 28a and the low side supply terminal of the frequency divider 25. Tuning capacitor 44b is coupled between the output of the inverter 28b and the low side supply terminal of the frequency divider 25. Tuning capacitor 44c is connected between the output of the inverter 28c and the low side supply terminal of the frequency divider 25.

As described previously, the output frequency of a ring oscillator such as the frequency divider 25 is dependent in part on the inherent capacitances of the transistors within the inverters 28a-28c. Thus, the output frequency of the frequency multiplier 25 can be adjusted by adjusting the capacitances at the input and output of the inverters 28a-28c. By adjusting the capacitances of the tuning capacitors 42a-42c and 44a-44c, the output frequency of the frequency divider 25 can be tuned to a desired frequency.

The tuning of the output frequency of the frequency divider 25 can be accomplished with the aid of a counter 40, as shown in FIG. 4. The counter 40 receives the output oscillator signal of the voltage controlled oscillator 22 and the output oscillator signal of the frequency divider 25. The counter 40 counts the oscillations of both the voltage controlled oscillator 22 and the frequency divider 25 in a given time period. By counting the oscillations of each signal, the counter 40 can indicate if the frequency divider 25 has divided the frequency of the oscillator signal of the voltage controlled oscillator 22 exactly in half. If the frequency from the frequency divider 25 is not exactly half, then there will be beat frequencies detected by the counter 40. The counter 40 can indicate what the output frequency of the frequency divider 25 is. The frequency can then be adjusted by adjusting the capacitances of the capacitors 42a-42c and 44a-44c. In this manner, the output frequency of the frequency divider 25 can be slightly increased or slightly decreased to achieve a selected frequency.

In an alternative embodiment, the number of cycles of the divider 25 is counted by the counter 40 in fixed number of cycles (N) of oscillator 22. One benefit of this scheme is that there is no need for any other timing reference and oscillator 22 itself acts like a reference and we count the number of cycles of the output of the divider 25 in fixed number of cycles (N) of oscillator 22. If the frequency of divider 25 is exactly half of the frequency of the oscillator 22, then the digital count will be about N/2±1 (±1 can be counting error by skipping edges at the start or stop of counting window). If the frequency of divider 25 is much greater or smaller than the free running output frequency of the oscillator 22, the generated count will be much greater or smaller than the ideal count of N/2±1. The divider 25 frequency can then be digitally corrected by switching capacitive 42a-42c and 44a-44c.

In one embodiment, this digital calibration can only be performed one time and can be switched off completely after frequency centering and/or injection locking to save power.

In one embodiment, the transistor 42a corresponds to a plurality of PMOS transistors having their gate terminals connected to the output of the inverter 28a. The transistors each have a different width-to-length ratio. For example, one transistor can have a width-to-length ratio that is twice as large as some base width-to-length ratio, a second transistor can have a width-to-length ratio that is four times as large, and a third transistor can have a width-to-length ratio that is eight times as large. The bodies of the transistors of the capacitor 42a are connected to the high side supply terminal of the frequency divider 25. The capacitor 42a therefore corresponds to an aggregate gate-to-body capacitance of several PMOS transistors. Tuning of the capacitor 42a is accomplished by coupling or decoupling gate terminals of selected ones of the transistors to the output of the inverter 28a. The variable capacitors 42b and 42c are identical to the variable capacitor 42a. Namely, they each include a plurality of PMOS transistors having different width-to-length ratios and whose gate terminals can be selectively coupled or decoupled to the output terminal of the respective inverter 28b or 28c. The body terminals are connected to the high side supply terminal of the frequency divider 25. The source, drain, and body transistors 42a-42c are all tied together and connected to the high side supply, while the gates are coupled to the outputs of the respective inverters.

In one embodiment, the variable capacitor 44a includes a plurality of NMOS transistors each having different width-to-length ratios and having their gate terminals connected to the output of the inverter 28a. The body terminals of the NMOS transistors of the variable capacitor 44a are connected to the low side supply terminal of the frequency divider 25. Tuning of the capacitor 44a can be accomplished by selectively coupling or decoupling the gate terminals of the transistors of the variable capacitor 44a to the output of the inverter 28a. The variable capacitor 44a therefore corresponds to the inherent gate-to-body capacitance of a plurality of NMOS transistors. The variable capacitors 44b and 44c are identical to the variable capacitor 44a. In particular, the variable capacitors 44b and 44c each include a plurality of NMOS transistors having different width-to-length ratios and having their gate terminals selectively coupleable to the output of the inverter 28b or 28c, respectively. The source, drain, and body transistors 44a-44c are all tied together and connected to the low side supply, while the gates are coupled to the outputs of the respective inverters. Tuning of the variable capacitors 42a-42c and 44a-44c is therefore accomplished by selectively coupling or decoupling transistors to the output terminals of the inverters 28a-28c.

Alternatively, the variable capacitors 42a-42c and 44a-44c can be of different types, or connected differently than described above. Those of skill in the art will understand that many other configurations are possible to achieve a frequency divider 25 having an adjustable output frequency. All such other configurations fall within the scope of the present disclosure.

Figure 5:
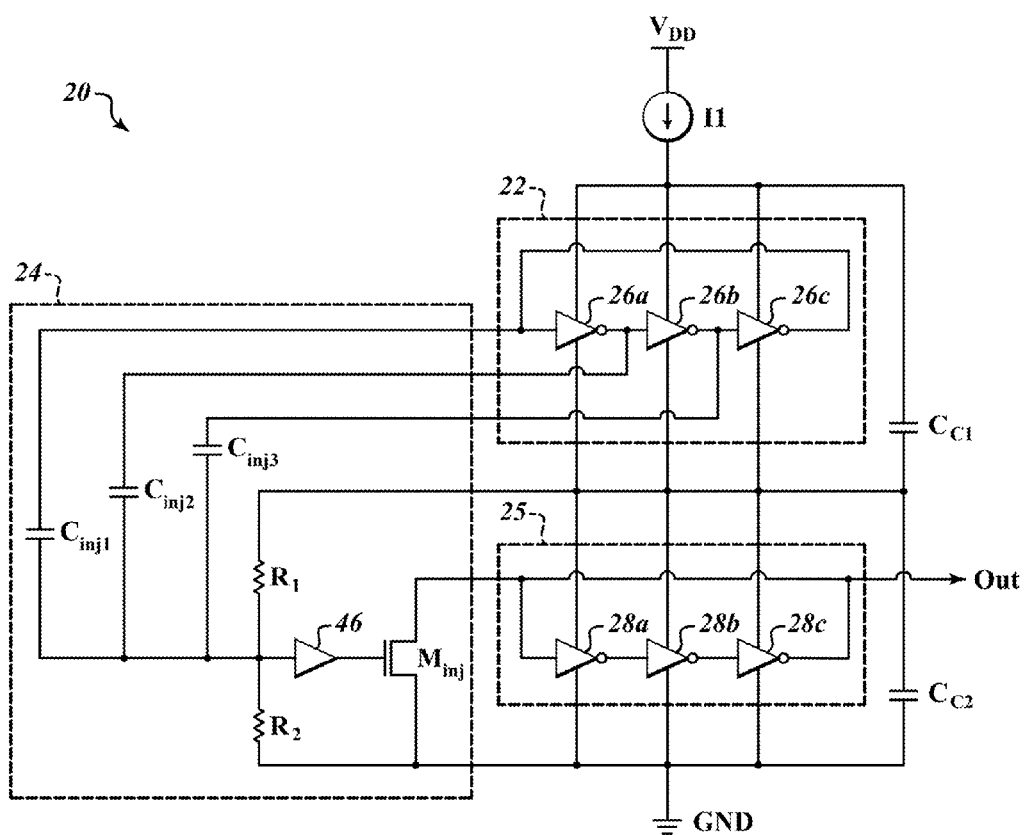
FIG. 5 is a schematic diagram of a voltage controlled oscillator, a frequency divider, and an injection network including multiple injection capacitors according to one embodiment.

FIG. 5 is a schematic diagram of a phase locked loop 20 including a voltage controlled oscillator 22 and a frequency multiplier 25 coupled to the voltage controlled oscillator 22 by an injection network 24. The voltage controlled oscillator 25 is the same as described previously with relation to FIGS. 2-4, except that the width-to-length ratios of the transistors of the inverters 28a-28c have changed, so that the output frequency is a multiple of the output frequency of the voltage controlled oscillator 22. In particular, the width-to-length ratios of the transistors of the inverters 28a-28c are less than the width-to-length ratios of the transistors of the inverters 26a-26c.

In one embodiment, the frequency multiplier 25 multiplies the frequency of the output oscillation signal of the voltage controlled oscillator 22 by 3/2. In this case, the width-to-length ratios of the transistors of the inverters 28a-28c is $2/3$ the width-to-length ratio of the transistors of the inverters 26a-26c of the voltage controlled oscillator 22. Because the width-to-length ratios of the transistors of the inverters 28a-28c are $2/3$ the size, they charge and discharge more quickly, and thus they can switch 1.5 times as fast as the inverters 26a-26c.

In order to implement improved injection locking to achieve a fractional multiplier, the injection network 24 is different than in FIGS. 2-4. In particular, the injection network 24 includes three injection capacitors $C_{inj1}$, $C_{inj2}$, and $C_{inj3}$. The injection network 24 further includes a buffer between the resistors $R_1$ and $R_2$ and the gate of the injection transistor $M_{inj}$. The injection capacitor $C_{inj1}$ is connected between the input of the inverter 26a and the input of the buffer 46. The buffer 46 is optional and act like isolation buffer for unilateralizing the injection. The injection capacitor $C_{inj2}$ is coupled between the input of the inverter 26b and the input of the buffer 46. The injection capacitor $C_{inj3}$ is connected between an input of the inverter 26c and the input of the buffer 46. In this way, three frequency signals are provided to the buffer 46. This causes three different frequency signals to appear at the gate of the injection transistor $M_{inj}$. This helps the frequency multiplier 25 to lock in at the frequency 3/2 times the frequency of the oscillator signal of the voltage controlled oscillator 22.

In one embodiment, the capacitance of the injection capacitors $C_{inj1}$, $C_{inj2}$, and $C_{inj3}$ are equal to each other. The buffer 46 supplies at its output the same signal that is on its input. As the oscillator signals filter through the capacitors $C_{inj1}$, $C_{inj2}$, and $C_{inj3}$, switch between high and low states in a manner that is out of phase with each other, the buffer 56 switches between the high and low states at a frequency that is higher than the frequency of any one of the frequencies supplied by the injection capacitors $C_{inj1}$, $C_{inj2}$, and $C_{inj3}$.

Figure 6:
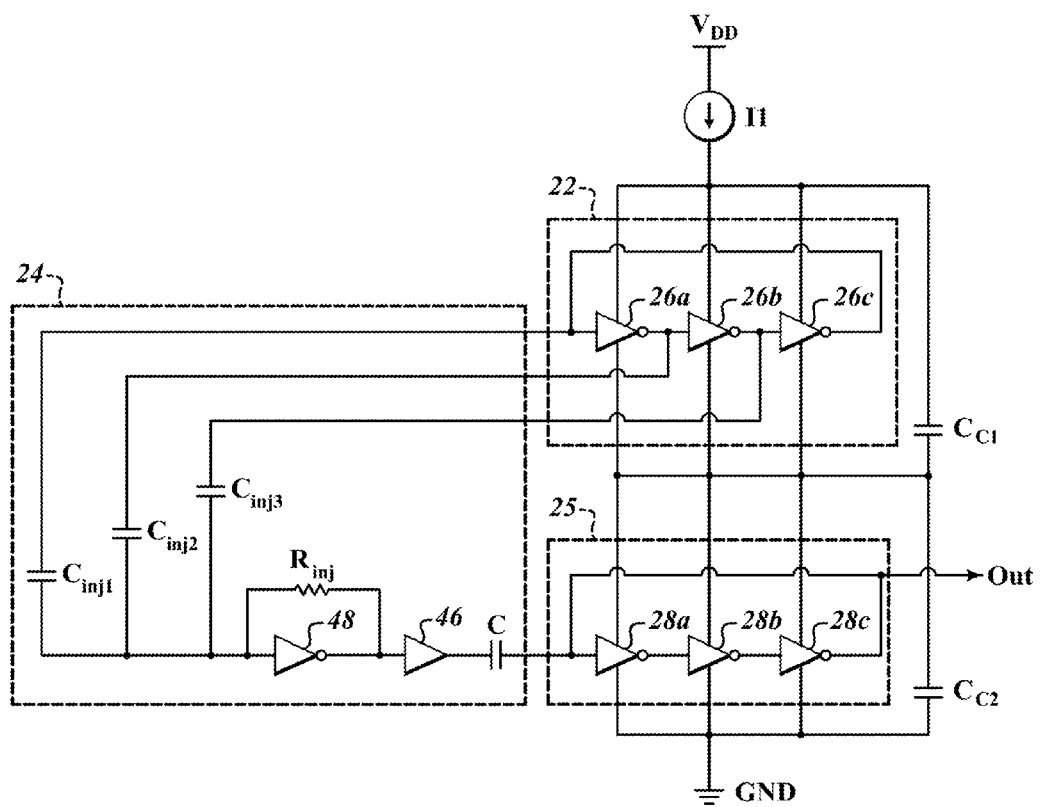
FIG. 6 is a schematic diagram of a voltage controlled oscillator, a frequency divider, and an injection network including an inverter and a buffer according to one embodiment.

FIG. 6 is a schematic diagram of a portion of a phase locked loop 20 including a voltage controlled oscillator 22 and a frequency multiplier 25. The voltage controlled oscillator 22 and the frequency multiplier 25 are the same as in FIG. 5, except that the frequency multiplier 25 in FIG. 6 is a three-times frequency multiplier. Thus, the width-to-length ratios of the transistors in the inverters 28a-28c are ⅓ the width-to-length ratios of the transistors in the inverters 26a-26c. This allows for a frequency multiplier 25 that outputs an oscillator signal at the frequency of three times the frequency of the output oscillator signal of the voltage controlled oscillator 22.

The injection network 24 of FIG. 6 includes three injection capacitors $C_{inj1}$, $C_{inj2}$, and $C_{inj3}$ as described previously with relation to FIG. 5. The injection capacitors $C_{inj1}$, $C_{inj2}$, and $C_{inj3}$ are equal to each other in capacitance. The injection network 24 of FIG. 6 differs from the injection network 24 of FIG. 5 in that the injection transistor $M_1$ is removed. An inverter 48 is coupled between the buffer 46 and the injection capacitors $C_{inj1}$, $C_{inj2}$, and $C_{inj3}$. An injection resistor $R_{inj}$ is connected in parallel with the inverter 48.

A capacitor C is coupled between the inverter 46 and the input of the frequency multiplier 25. The injection network 24 of FIG. 6 helps to suppress reference spurs in the output signal of the frequency multiplier 25. In particular, the injection network 24 acts as a filter for the original frequency output by the voltage controlled oscillator 22. This helps to ensure that the frequency is properly multiplied by a factor of 3 at the output of the frequency multiplier 25. The multiplier oscillator 25 also acts like a band-pass filter and assists in attenuating reference spurs arising from the mismatch of capacitors $C_{inj1-3}$ and inverters 26a-c.

The frequency multiplier 25 of FIG. 6 has been described as a three-times frequency multiplier. Those of skill in the art will understand that the frequency multiplier 25 can multiply the output frequency of the voltage controlled oscillator 22 by a different factor than 3. Those of skill in the art will further understand that many configurations and output frequencies are possible in light of the present disclosure. All such other configurations and output frequencies fall within the scope of the present disclosure.

Figure 7:
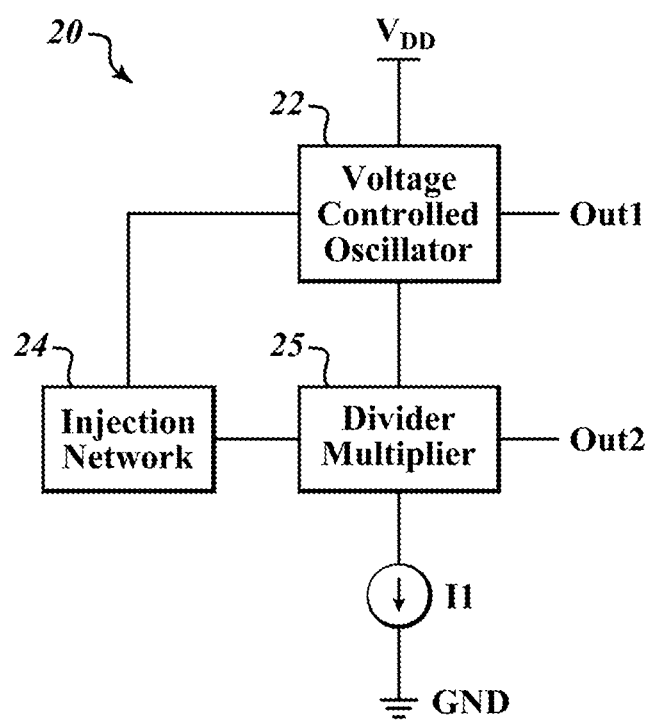
FIG. 7 is a block diagram of a phase locked loop according to one embodiment.

FIG. 7 is a block diagram of a phase locked loop 20 according to one embodiment. The phase locked loop 20 of FIG. 7 differs from the phase locked loop 20 of FIG. 1 in that the current source I1 is placed between the frequency divider 25 and ground. Those of skill in the art will understand that the current source I1 can be placed in this manner without detracting from the performance of the voltage controlled oscillator 22 and the frequency divider 25.

Figure 8:
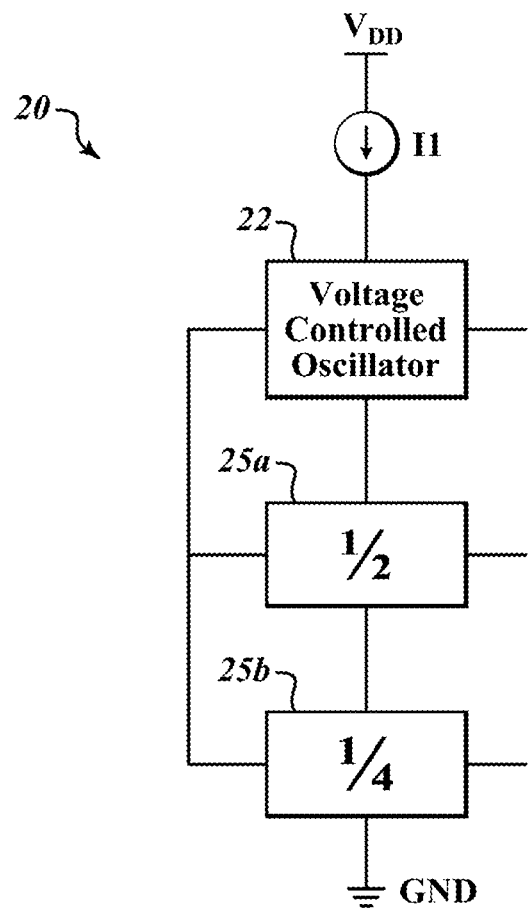
FIG. 8 is a block diagram of a voltage controlled oscillator and multiple frequency dividers in a stacked configuration according to one embodiment.

FIG. 8 is a block diagram of a stack of voltage controlled oscillators according to one embodiment. The voltage controlled oscillator 22 is coupled to a frequency divider 25a. The frequency divider 25a is coupled to a frequency divider 25b. In this embodiment, multiple frequency dividers are stacked with the ring oscillator 22. Both the frequency divider 25a and the frequency divider 25b reuse the current from the ring oscillator 22. In this way a divide-by-2 frequency divider 25a and a divide-by-4 frequency divider 25b are implemented in a stack with the voltage controlled oscillator 22. As described previously, because the frequency dividers 25a and 25b reuse the current from the voltage controlled oscillator 22, no extra power is consumed by the frequency dividers 25a and 25b. In this way, frequency dividers 25a and 25b can be implemented without any additional power cost.

The transistors included in the dividers 25a and 25b are sized appropriately with chosen width to length ratios with respect to main oscillator 22 in order to output frequencies that are the selected fraction of the oscillator 22, as described in more detail above.

To improve the correlation of free running frequencies, the dividers 25a and 25b can be tuned using tuning capacitors and digital calibration in conjunction with a counter in the manner shown in FIG. 4.

Those of skill in the art will understand that more than two frequency dividers can be implemented in the stack. This is limited only by the supply voltage available.

Figure 9:
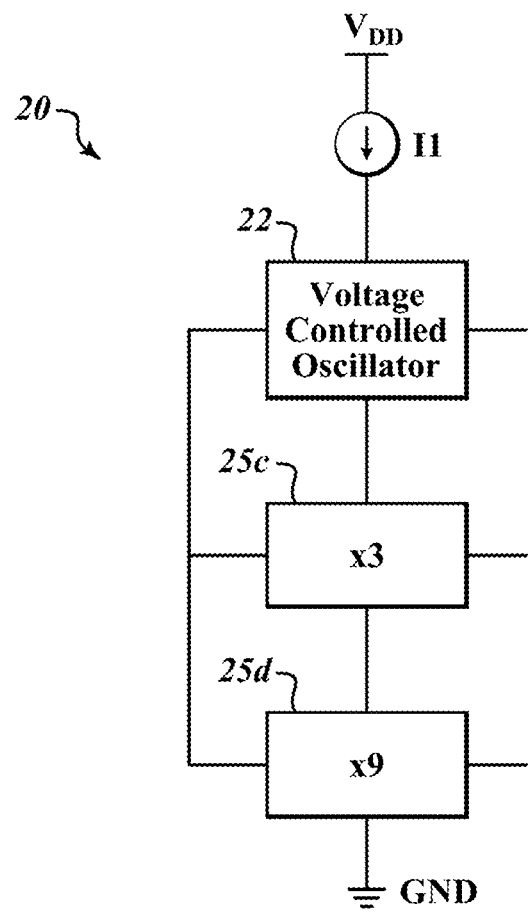
FIG. 9 is a block diagram of a voltage controlled oscillator and multiple frequency multipliers in a stack configuration according to one embodiment.

FIG. 9 is a block diagram of a phase locked loop 20 including a voltage controlled oscillator 22 and a frequency multiplier 25c and a frequency multiplier 25d in a stack configuration. As described previously, the frequency multipliers 25c and 25d reuse the current I1 that drives the voltage controlled oscillator 22. Thus, no extra power is consumed by implementing two additional frequency multipliers 25c and 25d.

The transistors included in the multipliers 25c and 25d are sized appropriately with chosen width to length ratios with respect to main oscillator 22 in order to output frequencies that are the selected fraction of the oscillator 22, as described in more detail above.

To improve the correlation of free running frequencies, the multipliers 25c and 25d can be tuned using tuning capacitors and digital calibration in conjunction with a counter in the manner shown in FIG. 4.

While only two frequency multipliers 25c and 25d are illustrated in FIG. 9, those of skill in the art will understand that more than two frequency multipliers can be implemented and reuse the current from the ring oscillator. The number of multipliers is limited only by available space on the die and voltage headroom available.

While in the foregoing disclosures and in the Figures the oscillators 22 and 25 have been described as voltage controlled oscillators, they could also be termed current controlled oscillators. The voltage controlled oscillators 22 and 25 are driven by a current source I1 derived from a control voltage Vc by any voltage-to-current conversion circuit. In one example, this voltage-to-current conversion can be done by a single MOS transistor. Thus, the oscillators 22 and 25 can be termed voltage controlled oscillators or current controlled oscillators.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
 a first power supply terminal configured to supply a high supply voltage;
 a current source coupled to the first power supply terminal and configured to generate a drive current;
 a second power supply terminal configured to supply a low supply voltage;
 a first ring oscillator configured to receive the drive current and to generate a first oscillation signal having a first frequency, the first ring oscillator including:
  a first output terminal supplying the first oscillation signal;
  a first input terminal configured to receive the first oscillation signal;
  a first supply terminal configured to receive the drive current; and
  a second supply terminal configured to output the drive current;
 an injection circuit coupled to the first ring oscillator and configured to receive the first oscillation signal from the first ring oscillator and to output an injection oscillation signal; and
 a second ring oscillator coupled to the first ring oscillator and the injection circuit and configured to output a second oscillation signal having a second frequency, the second ring oscillator including:
  a second output terminal supplying the second oscillation signal;
  a second input terminal configured to receive the second oscillation signal;
  a third supply terminal coupled to the second supply terminal and configured to receive the drive current from the second supply terminal; and
  a fourth supply terminal coupled to the second power supply terminal.

2. The device of claim 1 wherein the first ring oscillator includes a plurality of first inverters connected in series, the plurality of first inverters including a plurality of first transistors.

3. The device of claim 2 wherein the second ring oscillator includes a plurality of second inverters connected in series, the plurality of second inverters including a plurality of second transistors.

4. The device of claim 3 wherein second ring oscillator is a frequency multiplier configured to multiply the first frequency of the first oscillation signal, the second frequency being greater than the first frequency.

5. The device of claim 4 wherein the first transistors have a channel width to length ratio greater than a channel width to length ratio of the second transistors.

6. The device of claim 3 wherein the injection circuit includes a plurality of injection capacitors each coupled to a respective inverter output terminal of the first inverters.

7. The device of claim 3 wherein the second ring oscillator is a frequency divider configured to divide the first frequency of the first oscillation signal, the second frequency being smaller than the first frequency.

8. The device of claim 7 wherein the first transistors have a channel width to length ratio smaller than a channel width to length ratio of the second transistors.

9. The device of claim 3 wherein the second ring oscillator includes a plurality of tuning capacitors each coupled to a respective inverter output terminal of a respective second inverter.

10. The device of claim 9 wherein the second frequency can be adjusted by adjusting respective capacitances of the tuning capacitors.

11. The device of claim 10 wherein at least one of the tuning capacitors is coupled to the second power supply terminal.

12. The device of claim 10 wherein at least one of the tuning capacitors is coupled to the third supply terminal.

13. The device of claim 1 wherein the first frequency is substantially equal to the second frequency.

14. A device comprising:
 a current source configured to generate a drive current;
 a first oscillator coupled to the current source and configured to generate a first oscillation signal having a first frequency; and
 a second oscillator configured to generate a second oscillation signal based on the first oscillation signal, the second oscillation signal having a second frequency, the first oscillator being configured to pass the drive current to the second oscillator.

15. The device of claim 14 comprising an injection circuit coupled between the first and the second oscillators, the injection circuit configured to receive the first oscillation signal and to generate an injection signal based on the first oscillation signal, the injection signal having the first frequency.

16. A method comprising:
 supplying a drive current to a high side supply terminal of a first ring oscillator;
 generating a first oscillator signal on an output of the first ring oscillator;
 supplying the drive current from a low side supply terminal of the first ring oscillator to a high side supply terminal of a second ring oscillator;
 supplying the first oscillator signal to an input of the second ring oscillator; and
 generating a second oscillator signal on an output of the second ring oscillator.

17. The method of claim 16 wherein the second ring oscillator is a frequency divider, the method comprising dividing, in the second oscillator, the first oscillator signal, a frequency of the second oscillator signal being lower than a frequency of the first oscillator signal.

18. The method of claim 16 wherein the second ring oscillator is a frequency multiplier, the method comprising multiplying, in the second oscillator, the first oscillator signal, a frequency of the second oscillator signal being greater than a frequency of the first oscillator signal.

* * * * *